US008361893B2

(12) United States Patent
Schmidt et al.

(10) Patent No.: US 8,361,893 B2
(45) Date of Patent: Jan. 29, 2013

(54) SEMICONDUCTOR DEVICE AND SUBSTRATE WITH CHALCOGEN DOPED REGION

(75) Inventors: Gerhard Schmidt, Wernberg (AT); Hans-Joachim Schulze, Taufkirchen (DE); Bernd Kolbesen, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/075,475

(22) Filed: Mar. 30, 2011

(65) Prior Publication Data
US 2012/0248576 A1    Oct. 4, 2012

(51) Int. Cl.
*H01L 21/265* (2006.01)
(52) U.S. Cl. .. 438/518; 438/918; 438/938; 257/E21.068
(58) Field of Classification Search .................. 438/510, 438/514, 518, 526; 257/E31.029, E21.068
See application file for complete search history.

(56) References Cited

U.S. PATENT DOCUMENTS

| 7,233,031 | B2 * | 6/2007 | Mauder et al. ............... 257/163 |
| 7,687,891 | B2 * | 3/2010 | Schulze et al. ............... 257/653 |
| 2001/0005036 | A1 | 6/2001 | Porst et al. |
| 2006/0035436 | A1 * | 2/2006 | Schulze ....................... 438/345 |
| 2009/0283866 | A1 | 11/2009 | Schulze et al. |
| 2009/0298270 | A1 | 12/2009 | Mauder et al. |

FOREIGN PATENT DOCUMENTS

DE    102008025733 A1    12/2009

OTHER PUBLICATIONS

Sze, S. M., "Physics of Semiconductor Devices", Second Edition, Wiley, 1981, p. 69.
Strunk, H., et al., "Intersitial supersaturation near phosphorus-diffused emitter zones in silicon", Appl. Phys. Lett. 34 (8), 1979 American Institute of Physics.
Ammerlaan, C.A. et al., "Landolt-Börnstein", Springer-Verlag, 1989.

* cited by examiner

*Primary Examiner* — Leonard Chang
(74) *Attorney, Agent, or Firm* — Murphy, Bilak & Homiller, PLLC

(57) ABSTRACT

An undoped semiconductor substrate is doped by applying stress at a side of the undoped semiconductor substrate to release self interstitials in the substrate and implanting chalcogen atoms into the side of the substrate. The substrate is annealed to form a first semiconductor region containing the chalcogen atoms and a second semiconductor region devoid of the chalcogen atoms. The first semiconductor region has a doping concentration higher than the doping concentration of the second semiconductor region. The indiffusion of chalcogen atoms into a semiconductor material in the presence of self interstitials can also be used to form field stop regions in power semiconductor devices.

17 Claims, 15 Drawing Sheets

SEMICONDUCTOR DEVICE AND SUBSTRATE WITH CHALCOGEN DOPED REGION

FIELD OF TECHNOLOGY

The present application relates to semiconductor devices and substrates, in particular semiconductor devices and substrates having a chalcogen doped region.

BACKGROUND

To limit switching losses in power semiconductor devices such as IGBTs (insulated gate bipolar transistors) and the associated recovery diode, JFETs (junction field effects transistors), power MOSFETs (metal oxide semiconductor field effect transistors) and power diodes, a field stop zone is typically built into the construction from the rear side of the die. Accordingly, the low impedance base, which accommodates the blocking layer, is reinforced with doping at the surface so that further expansion of the electric field is suppressed when the blocking voltage is increased.

To ensure the rear side emitter (for instance with an IGBT) is still sufficiently efficient, the total amount of the electrically-active field stop zone for the breakdown charge must not exceed approximately $1 \cdot 10^{12}$ cm$^{-2}$. Conventional field stop zones have a typical penetration depth of about 10 to 20 µm, the typical surface concentration occurring with diffusion of a doping substance such as phosphorous implanted for example with ion implantation approximately at $10^{15}$ cm$^{-3}$ during a high temperature process.

Since an n-doped high impedance base material is typically used to form field stop zones for power semiconductor devices, the donor is usually employed as a doping substance. Standard pentavalent elements which are used for n-doping such as phosphorus, arsenic or antimony are typically used as the field stop implant. These elements, however, have the disadvantage that in order to achieve diffusion at depths of 10 to 20 µm, a relatively high thermal budget (time, temperature) must be used. However, high thermal budgets are not economical or compatible with the superstructure device formed at the front side of the die. Improved dynamic characteristics are also required during a further development of such structural elements in order to further increase the depth of the field stop zone e.g. to a depth of 50 µm or more.

Chalcogens such as sulfur, selenium and tellurium have been employed to fabricate field stop zones for power semiconductor devices. Chalcogens belong to group 16 of the periodic table of elements and have the effect of double donors. Chalcogen elements also have a higher diffusion constant than pentavalent elements, so that already at moderate process temperatures approximately between 900° C. and 1,000° C., penetration depths up to 30 µm can be realized. These types of field stop zones can be sufficient for blocking voltages up to about 600V. However, deeper penetrating field stop zones are needed in order to block higher voltages e.g. 1200V and above.

Phosphorous doping is also widely employed to provide base n-type doping for semiconductor substrates such as silicon wafers prior to device fabrication. For example, an n-doped float zone base material is used as starting material whereby the specific resistance is adjusted during the crystal growth. As an alternative, neutron radiation is carried out with a starting material which has very high impedance, whereby silicon is converted into phosphorus with a nuclear reaction with so called neutron transmutation doping (NTD). Due to a small capture profile for the neutrons, this NTD yields a very homogenous doping throughout the Si member. Radial resistance fluctuations can be greatly reduced, which means that the material can be used for applications in which high voltages are employed.

However, the application of float zone materials has disadvantages. For example, the application of float zone materials is relatively expensive and imposes limits on the size of the wafer which can be used. On the other hand, it is significantly cheaper to use Czochralski material, which can be manufactured by drawing from a crucible, and which can yield larger diameter wafer for memory or logic structural components. Nevertheless, due to a high reactivity of silicon, the starting material is characterized by a high level of oxygen impurities (from air) and also of carbon (from the crucible material). These impurities which occur mostly in the form of oxygen precipitates are removed with diffusion through a suitable thermal treatment above 1,000° C. in deep layers of the wafer, wherein a so-called denuded zone (DZ) is formed on the side which is mostly free of impurities. This zone is used mostly for the manufacturing of lateral structural components. Standard CZ material typically has a DZ depth of 10-20 µm and is adequate for memory and logic structural components.

However, if the material is used for the manufacturing of power semiconductor components which have a vertical superstructure, the depth of the DZ must be adjusted to match the length of the drift zone. Accordingly, the DZ must be extended for the voltage range of 400 V to 1,200 V with a depth of at least 40 µm to 120 µm. For the above mentioned reasons relating to costs and ratios, it is very desirable when such a starting material is used also for the manufacturing of power semiconductor devices such as e.g. IGBTs, JFETs, power MOSFETs and diodes. After the cell structure has been formed on the front side (e.g. DMOS cells, anodes, etc.), the remaining precipitate-rich material is then carried away from the DZ so that the remainder of the processing is performed from the rear side of the device. This includes for example the introduction of the field stop zone or of an emitter on the rear side by using a sufficiently low thermal budget.

As such, a CZ material which has a sufficiently high DZ depth is typically used for semiconductor devices. Such a material is offered under the label "Magic Denuded Zone" (MDZ) by the Monsanto Electronic Materials Company (MEMC) with wafer diameters of 6", 8" and 12". With suitable RTP (rapid thermal processing), the crystal is strongly oversaturated in empty position locations so that a sink is provided in a sufficiently large depth for the diffusion which removes the oxygen. Another possibility is the use of magnetically drawn CZ material (MCZ). The crystal growth process during which oxygen is also implemented in the crystal is in this case reduced by a magnetic field and the development of oxygen precipitates is thus prevented. One problem, however, exists with respect to the relatively low tolerance which is created for the concentration of the doping material of the starting material for employment in power semiconductor devices.

Radial variations of the specific resistance are in this case due to the manufacturing process which is used for the CZ material in the range from several to more than 10%. This is caused by radial fluctuations (striations) of the doping substance, which in turn are due to the currents existing in the fluid phase and the variations that are created throughout the wafer with the segregation of the doping substance in the melt. Doping variations in the vertical direction of the Si rod can be much more severe. On the other hand, the usual specification for the FZ material, which is used as a standard, allows only for a variation of ±15%.

The variations of the raw values can be reduced when a starting material is used which is only slightly doped and the material is then adjusted using a targeted proton irradiation. However, very high energy levels are required with an increased drift zone in order to guarantee full penetration of the radiation.

SUMMARY

According to an embodiment of a method of doping an undoped semiconductor substrate, the method includes applying stress at a side of the undoped semiconductor substrate to release self interstitials in the substrate, implanting chalcogen atoms into the side of the substrate and annealing the substrate to form a first semiconductor region containing the chalcogen atoms and a second semiconductor region devoid of the chalcogen atoms. The first semiconductor region has a doping concentration higher than the doping concentration of the second semiconductor region.

According to an embodiment of a semiconductor substrate, the substrate includes a first side, a second side opposite the first side and a semiconductor material extending between the first and second sides. The semiconductor material is devoid of active device regions and has a first region and a second region. The first region extends from the first side to a depth into the semiconductor material and includes chalcogen dopant atoms which provide a base doping concentration for the first region. The second region extends from the first region to the second side and is devoid of base doping.

According to an embodiment of a method of fabricating a power semiconductor component, the method includes forming an active region of a semiconductor device in a first region of a semiconductor substrate adjacent a first side of the semiconductor substrate, applying stress at a second side of the semiconductor substrate opposite the first side so that self interstitials are released in a second region of the semiconductor substrate adjacent the second side, and implanting chalcogen atoms into the second side of the semiconductor substrate. The method further includes annealing the semiconductor substrate so that the chalcogen atoms indiffuse into the semiconductor substrate to form a field stop zone in the second region which extends from the second side into the semiconductor substrate.

According to an embodiment of a power semiconductor component, the component includes a semiconductor substrate having a first side, a first region adjacent the first side, a second side opposite the first side, and a second region adjacent the second side so that the second region is interposed between the first region and the second side. The component further includes an active region of a semiconductor device disposed in the first region and a field stop zone disposed in the second region. The field stop zone includes chalcogen dopant atoms which provide a doping concentration for the field stop zone. The chalcogen dopant atoms extend from the second side to a depth of at least 50 µm into the semiconductor substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
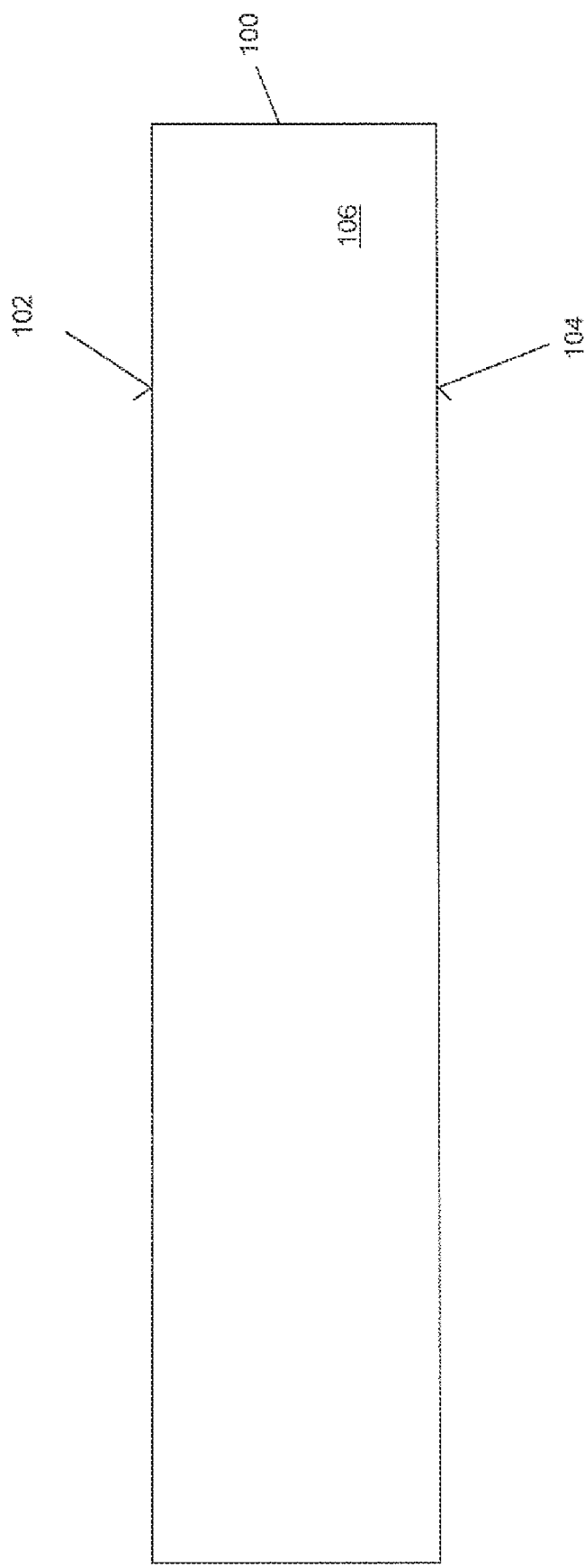
FIGS. 1-5 illustrate perspective cross-sectional views of an undoped semiconductor substrate during different process steps of an embodiment of doping the substrate.

Chalcogens tend to create cluster formations in a semiconductor lattice such as a Si lattice. Chalcogen pairs form complexes of a higher order close to the implanted surface with its own kind of donor conditions, as opposed to being isolated to an atom which is positioned at one place in the lattice. Chalcogens are stored preferably on crystal defects close to the wafer surface where they are electrically active only to a very small extent. Accordingly, the depth of the defect at the side of the crystal, as well as disturbances of the lattice which can be caused by the actual ion implantation can have a decisive influence on the subsequent diffusion conduct (diffusion to the side or diffusion to the lattice defects produced in this manner). For example, the use of selenium as a doping substance results in a small percentage of the implanted dose of the substance being in-diffused electrically activated under typical curing conditions of e.g. 900 to 1000° C.

The diffusion mechanism of selenium is enhanced in the presence of self-interstitial atoms e.g. of silicon self interstitials in the case of a silicon wafer. Selenium atoms located in fixed lattice positions are evicted by the self-interstitials into an intermediate lattice where they become mobile. The more the lattice is oversaturated with self-interstitial atoms, the greater the diffusion constant of the selenium atoms due to the increased mobility. To achieve the highest diffusion depths possible with a limited thermal budget, point defects (interstitials) that are created with implantation of ions should be created with a suitable temperature and with a time profile which has the highest possible efficiency (IED=implantation enhanced diffusion), along with diffusion in an oxidizing atmosphere e.g. during a thermal oxidation or a pyrolytic TEOS decomposition of $SiO_2$. The lattice is thus additionally oversaturated with Si self-interstitial lattice atoms. These self-interstitial lattice atoms enhance the diffusion characteristics of implanted chalcogen atoms.

Chalcogens act as double donors and have a high diffusion constant as compared to pentavalent elements such as P, As or Sb, so that higher introduction depths can be realized during the same processing temperatures such as between 900° C. and 1,000° C. For example, Se implantation and diffusion can be used with IGBTs, JFETs, power MOSFETs and diodes, in addition to or as an alternative to proton irradiation, to form a rear-side field stop zone in the high voltage segment.

Selenium diffuses interstitially, where the inward diffusion is accelerated when the semiconductor crystal is oversaturated with self interstitial lattice atoms (self interstitials) as selenium atoms located in lattice positions are evicted by the self interstitials into the intermediate lattice where they are mobile. The stronger the oversaturation of the lattice with e.g. interstitial Si atoms, the higher the diffusion coefficient. In addition, because of the supply of self interstitials, which are present for example with thermal oxidation or with diffusion of phosphorus including a high surface concentration, the diffusion depth of Se or other chalcogens such as S or Te can be further increased with a comparable thermal budget.

A strong segregation/outdiffusion of selenium (or other chalcogen) takes place at the same time, either in the oxide which is grown in this manner or in the surface regions of a phosphorus-containing layer. The maximum concentration of selenium is in this case strongly decreased during the inward diffusion, so that with higher diffusion depths it is no longer guaranteed for a dose that is required for an effective field stop. However, an increase of the implantation dose which is used to compensate for these losses is successful to a limited extent because as the dose is increased, the Si lattice is increasingly amorphized on the side with the ion implantation and the tendency of selenium or other chalcogen to form inactive clusters in the damaged crystal region supports and further intensifies the loss on the electric active centers under these circumstances. This conduct sets the optimal chalcogen dose to approximately $1 \cdot 10^{14}$ cm$^{-2}$ and leads together with the segregation or outward diffusion to an electrically effective dose component of a few percent. Other implantation doses are contemplated, however.

Selenium has four discrete energy levels which are associated with the simple and double interference positions of a substitution integrated Se atom or a Se pair. After annealing, the pair centers disappear in the DLTS (deep level transient spectroscopy) spectrum almost completely at a temperature above 900° C., so that the energy level associated with the individual Se interference position at 250 meV (for the single charge center) and at 496 meV (for the double charge center) prevail under the conduction band in the spectrum. An oppositely oriented mechanism of segregation is created in particular when a phosphorus-driven inward diffusion is employed in the highly doped phosphorus surface layer for formation of an arch-shaped diffusion profile with a wide maximum in the vertical depth. This effect can be utilized to adjust an inward diffusion reaching as deep as possible with a gradient that is as flat as possible to a sufficiently low level so as to adjust the base doping concentration of a high-impedance starting material. In one embodiment, the indiffusion of phosphorus is conducted with a gas phase e.g. from a POCL$_3$ or PH$_3$ doping source, or from another gas combination containing phosphorus. Doing so produces a very high surface concentration of phosphorus and the lattice can thus be effectively oversaturated with self interstitials. In another embodiment, P-implantation can be carried out to release the self interstitials. The doses in this case are on the order of magnitude of $10^{15}$ to $10^{16}$ cm$^{-2}$.

The high surface concentration of phosphorus can be eventually used with power diodes for a rear side emitter. An additional process for the diffusion of an anode region is required at a high temperature after the thinning of the semiconductor substrate. For example, an RTP or LTA (laser thermal anneal) step can be employed to form the anode region. In one embodiment, the highly doped surface layer is formed after the inward diffusion of Se, for example with a CMP (chemical mechanical polishing) stage, and then the processes on the front side (e.g. anode, IGBT cell structure, etc.) are completed. Thinning and the rear side processes can then be carried out for example after an established thin wafer process.

FIGS. 1-5 illustrate an undoped semiconductor substrate 100 during different process steps of an embodiment of doping the undoped substrate 100. FIG. 1 shows the undoped semiconductor substrate 100 such as an undoped Si wafer having a front side 102, a backside 104 opposite the front side and a semiconductor material 106 extending between the front and back sides 102, 104. The semiconductor substrate 100 is undoped at this stage, and therefore the semiconductor material 106 is devoid of active device regions such as diode and/or transistor components (anodes, cathodes, emitters, sources, drains, cathodes, gates, etc.).

Figure 2:
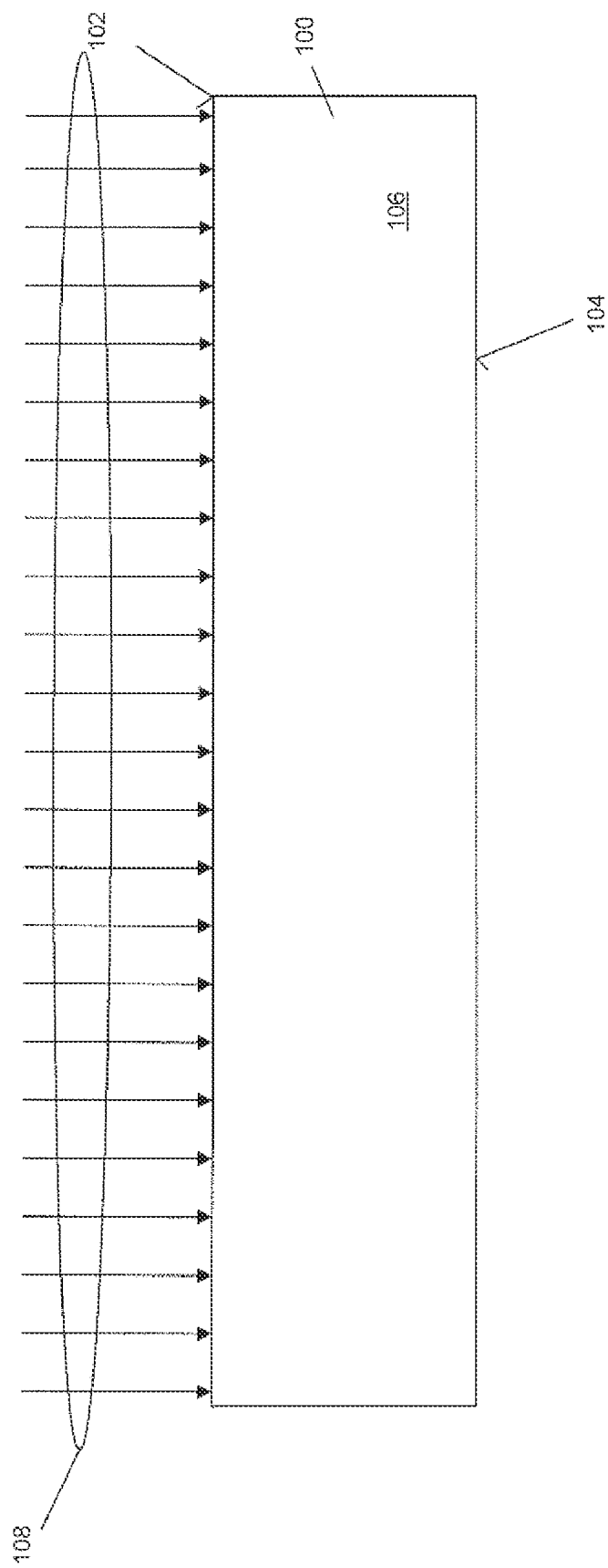

FIG. 2 shows the semiconductor substrate 100 during implantation of chalcogen atoms 108 such as Se, S or Te atoms. In one embodiment, the chalcogen atoms 108 are $^{80}$Se atoms implanted at a dose of at least $6 \cdot 10^{13}$ cm$^{-2}$ e.g. $7 \cdot 10^{13}$ cm$^{-2}$ at an energy of at least 150 keV e.g. 170 KeV.

Figure 3:
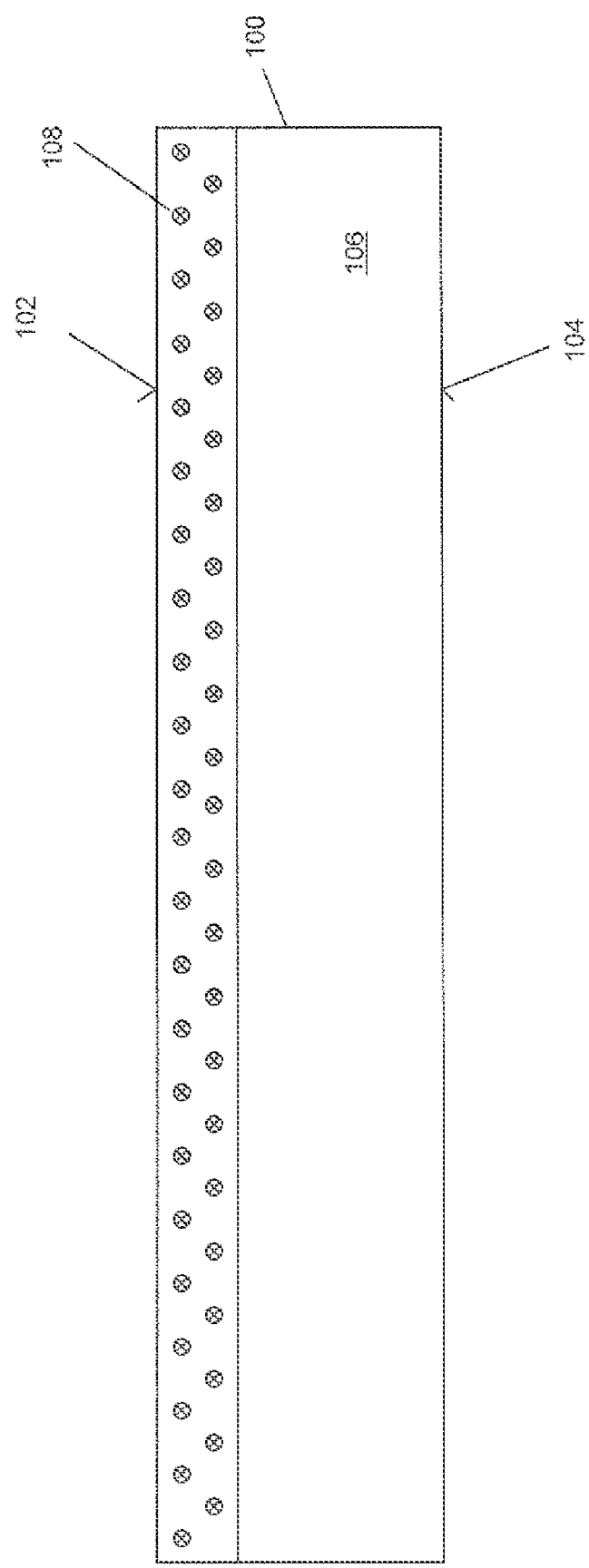

FIG. 3 shows the semiconductor substrate 100 after the chalcogen atoms 108 are implanted into the front side 102 of the substrate 100. The chalcogen atoms 108 penetrate to a depth $d_1$ which is a function primarily of the implantation energy.

Figure 4:
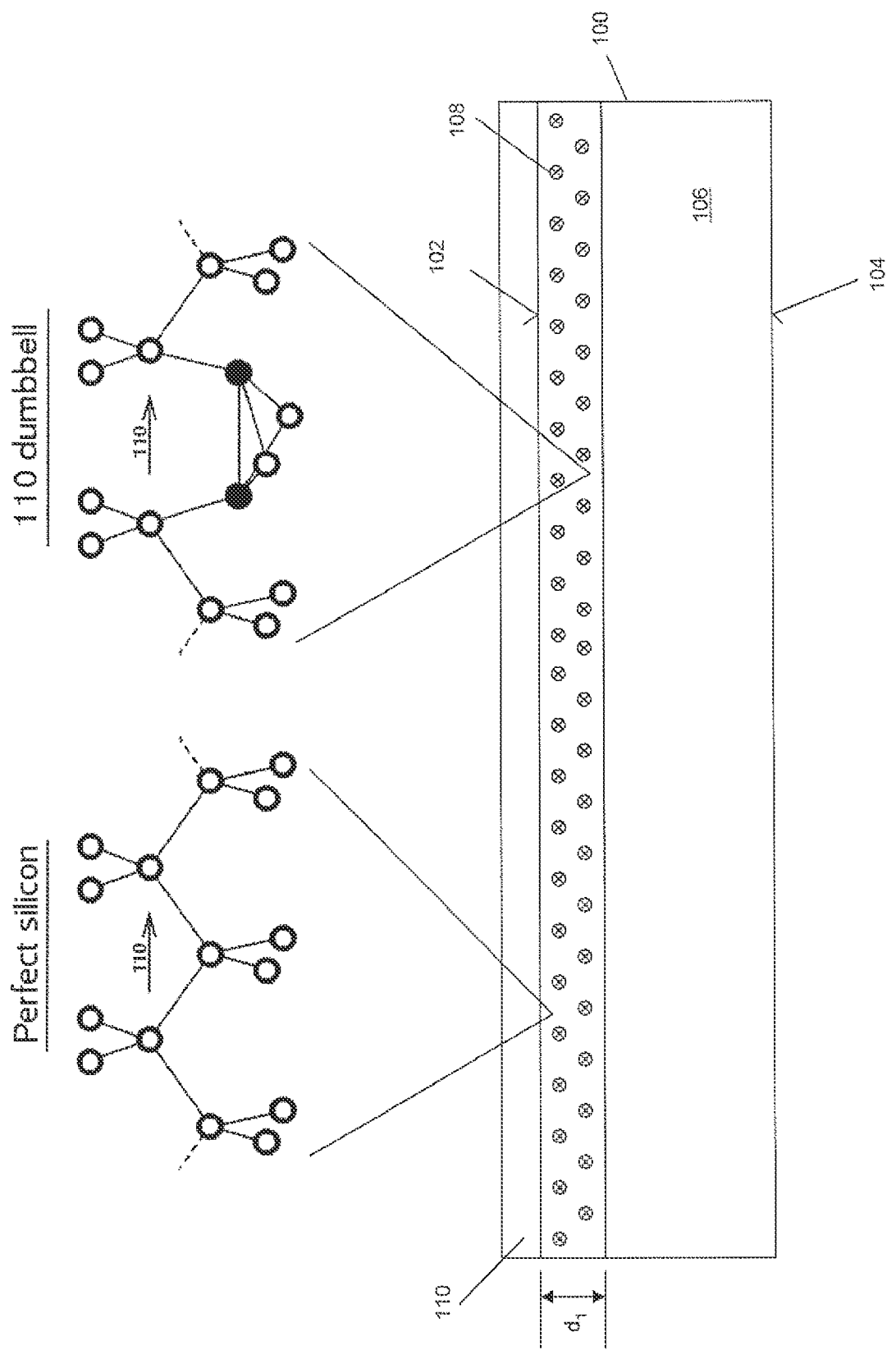

FIG. 4 shows the semiconductor substrate 100 after a stress-inducing layer 110 is formed on the front side 102 of the substrate 100. The stress-inducing layer 110 applies stress to the substrate 100, causing self interstitials (e.g. Si self interstitials in the case of a Si substrate) to release in the substrate 100. In one embodiment, the stress-inducing layer 110 is a phosphoric glass formed in an atmosphere comprising PH$_3$ e.g. for at least 200 minutes at a temperature of at least 900° C. The diffusion of phosphorus over-saturates the substrate 100 with interstitials. Due to the high solubility, a correspondingly high supply of phosphorus ions induces a lattice stress which shifts the equilibrium between empty positions (vacancies) and interstitial lattice atoms, creating favorable conditions for diffusion of chalcogen atoms such as selenium.

In one embodiment, the diffusion of phosphorus takes place in a gas phase, for example with a POCl$_3$ or PH$_3$ doping source or another compound with a gas containing phosphorus. For example, the atmosphere during the depositing process can include N$_2$, O$_2$ and PH$_3$. In each case, the oversupply of phosphorus atoms is basically automatically adjusted with the growth of phosphoric glass. In contrast to depositing in advance which is performed by ion implantation, diffusion from an inexhaustible source leads to a permanent subsequent supplying of interstitials. Although with implantation of ions, the product defects generated in this manner cause initially a corresponding increase of the diffusion constant, this constant decreases again with a certain time constant. On the other hand, very high phosphorus doses, typically $\geq 1 \cdot 10^{16}$ cm$^{-2}$, are implanted for an effective interstitial oversaturation of the lattice.

In another embodiment, the stress-inducing layer 110 is a thermal oxidation layer formed on the substrate 100. Any other material layer can be formed on the substrate 100 which applies stress to the substrate 100, thereby releasing self interstitials in the substrate 100. As a result of the stress-inducing layer 110, some of the semiconductor atoms remain on lattice cites while others (self interstitials) do not. FIG. 4 shows an exploded view of a portion of perfect Si lattice in the <110> orientation and a dumbbell Si self-interstitial where the dumbbell atoms are not centered on perfect lattice sites. The Si self interstitials may of course have other structures.

An accelerated indiffusion of the chalcogen atoms 108 is induced by the self interstitials present in the semiconductor substrate 100. This diffusion mechanism is much more effective than the mere intrinsic diffusion of chalcogen atoms (i.e. the indiffusion of chalcogen atoms absent the presence of self interstitials). Since conventional intrinsic diffusion e.g. of phosphorus to provide a base doping concentration is not based on oversaturation of the lattice with point defects, a substantially higher thermal budget (time, temperature) is required to achieve the same diffusion depth result. Accordingly, base doping can be realized with a high-resistivity starting material at a much lower thermal budget using the Se indiffusion techniques described herein.

Figure 5:
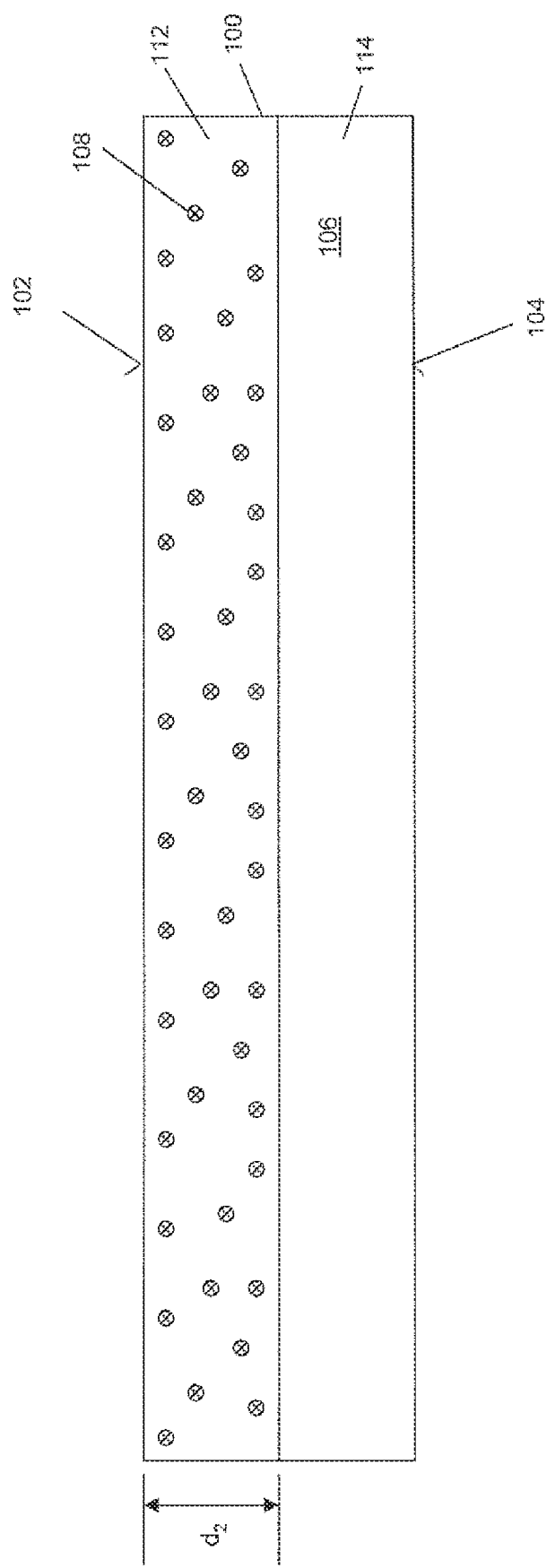

FIG. 5 shows the semiconductor substrate 100 after annealing. The stress-inducing layer 110 is preferably removed prior to annealing, but can remain in place if desired. The annealing process causes the chalcogen atoms 108 to indiffuse into the substrate 100, accelerated by the self interstitials. In one embodiment, the annealing is performed for less than 60 minutes at a temperature less than 1000° C. After annealing, the semiconductor material 106 has a first region 112 and a second region 114. The first region 112 extends from the front side 102 to a depth into the semiconductor material 106 and includes the indiffused chalcogen dopant atoms 108 which provide a base doping concentration in the first region 112. The second region 114 extends from the first region 112 to the backside 104 of the substrate 100 and is devoid of base doping and therefore is more resistive than the first region 112. That is, the second region 114 remains intrinsic i.e. does not have any significant dopant species present. The term devoid as used herein meaning not possessing, untouched by, void, or destitute, or substantially not possessing, untouched by, void, or destitute. Accordingly, the second region 114 may contain some chalcogen atoms 108, but not a meaningful concentration.

In one embodiment, the stress-inducing layer 110 is formed after the chalcogen atoms 108 are implanted into the substrate 100 as shown in FIGS. 2-4. In another embodiment, the stress-inducing layer 110 is formed before the chalcogen atoms 108 are implanted. According to this embodiment, the undoped semiconductor substrate 100 is an undoped silicon substrate. The stress-inducing layer 110 is formed one side of the undoped silicon substrate 100 to impart stress which releases silicon self interstitials in the silicon substrate 100. The stress-inducing layer 110 is removed after the silicon self interstitials are released. The chalcogen atoms 108 are implanted into the silicon substrate 100 after the stress-inducing layer 110 is removed. The silicon substrate 100 is then annealed to accelerate the indiffussion of the chalcogen atoms 108 into the silicon substrate 100 to a depth $d_2$ of at least 30 µm from the top side 102 as shown in FIG. 5. Alternatively, the stress-inducing layer 110 may be formed on the backside 104 of the substrate and the chalcogen atoms 108 implanted into the backside 104.

Figure 6:
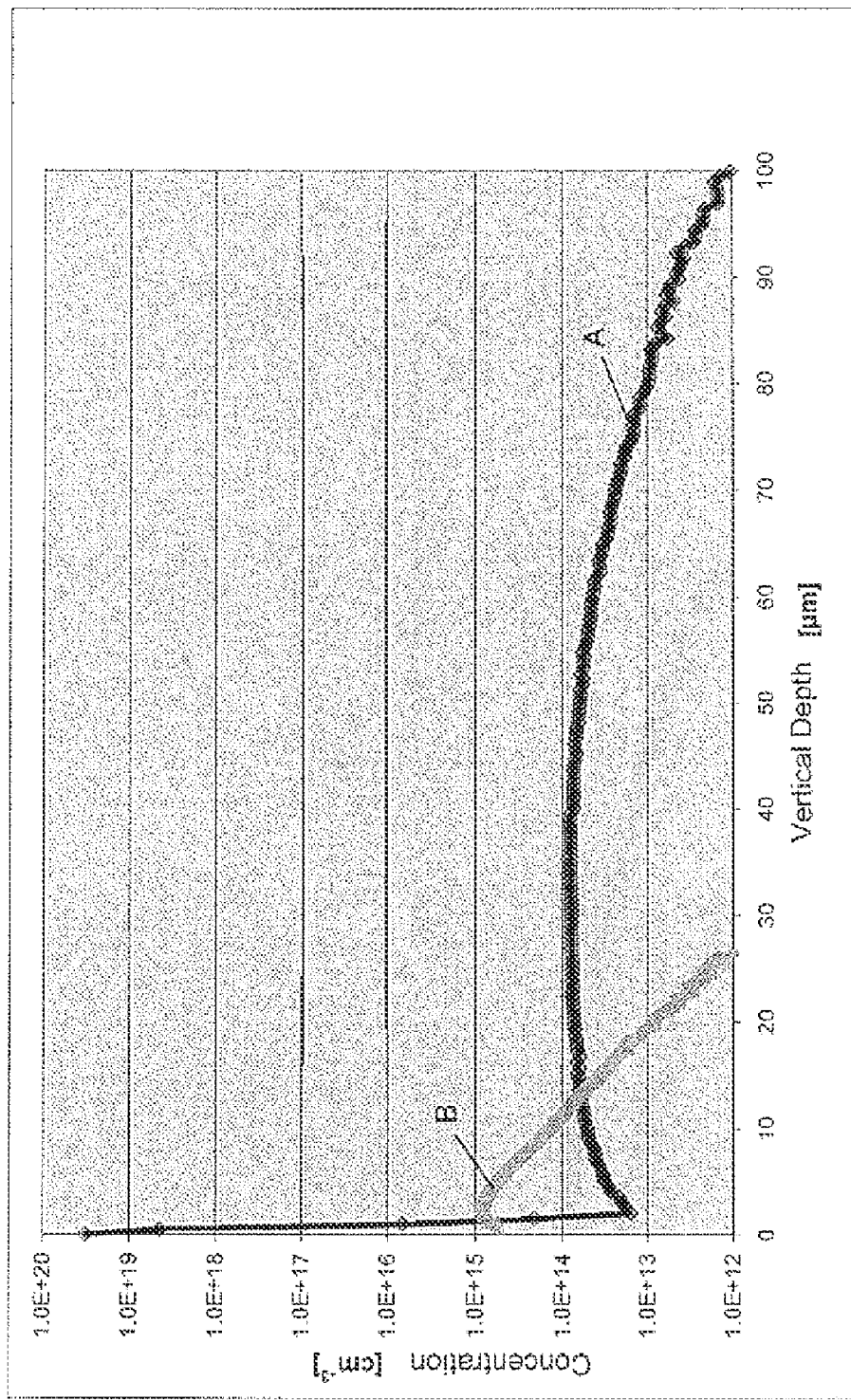
FIG. 6 is a plot of diffusion profiles for selenium indiffusion into a semiconductor substrate.

FIG. 6 shows diffusion profiles for selenium indiffusion obtained with measurements by using spreading resistance (SR) in an inert atmosphere without and with high surface phosphorus concentration i.e. with and without a phosphorous containing stress-inducing layer. Se dopant concentration (y-axis) versus implantation depth (x-axis) is plotted in FIG. 6. Curve 'A' represents a sample implanted with Se and subjected to $PH_3$ deposition, and curve 'B' represents a sample implanted with Se and no $PH_3$ deposition. Neither sample had any n-type base doping concentration prior to Se implantation and annealing to eliminate the contribution of n-base material. Ion implantation was performed in both samples using $^{80}Se$ with a dose of $7·10^{13}$ cm$^{-2}$ and energy of 170 keV. While the reference sample (curve B) was obtained with the diffusion lasting 30 minutes at 950° C. in an N2 atmosphere, depositing of phosphorus in advance was used with the second sample (curve A), which is usually employed e.g. for polysilicon doping during MOS processes. The atmosphere during the phosphorus depositing process included a mixed gas containing $N_2$, $O_2$ and $PH_3$. In this example, the phosphorus was deposited at 930° and with a plateau time of 70 minutes, causing the self interstitials. The resulting phosphoric glass was then removed prior to Se implantation. The subsequent introduction of Se was performed together with the reference sample.

Despite identical Se introduction conditions (dose and energy), a significantly deeper indiffusion of the implanted Se results with the phosphorus-coated sample (curve A). This is attributable to the high surface concentration of more than $10^{19}$ cm$^{-3}$ phosphorous atoms generated with the $PH_3$ deposition. Due to the segregation/getter effect of phosphorus, a decline in the concentration is created toward the deposition side. However, with the presence of self-interstitials during the introduction of Se, an ultra-deep inward diffusion occurs with approximately a quadruple depth when compared to the reference sample in the embodiment shown here. This exemplary Se diffusion profile is suitable e.g. for a 600 V power semiconductor device which requires a chip thickness of about 60 µm. In contrast, the diffusion profile of the reference sample (curve B) practically achieve its final Se diffusion depth after 10 minutes, since the characteristic IED time constant at 950° C. is at this order of magnitude. After that, further indiffusion takes place only with a smaller intrinsic diffusion constant of about two orders of magnitude, which is to say it almost comes to a standstill. An extension of the diffusion time or a subsequent sharp increase of the temperature no longer change significantly the depth distribution of the Se atoms. Only the concentration of Se in the implantation surface region is further increased with such an additional annealing stage.

After the highly doped stress-inducing layer is removed, for instance with CMP, standard front-side device processes and if applicable diffusion of a heavy metal can be carried out for a long term adjustment of the lifetime of the free charge carrier. This can be followed by thinning of the wafer and finishing the back-side processes, which can be performed with typical thin wafer processes e.g. by a proton field stop, backside emitter implantation and LTA.

Figure 7:
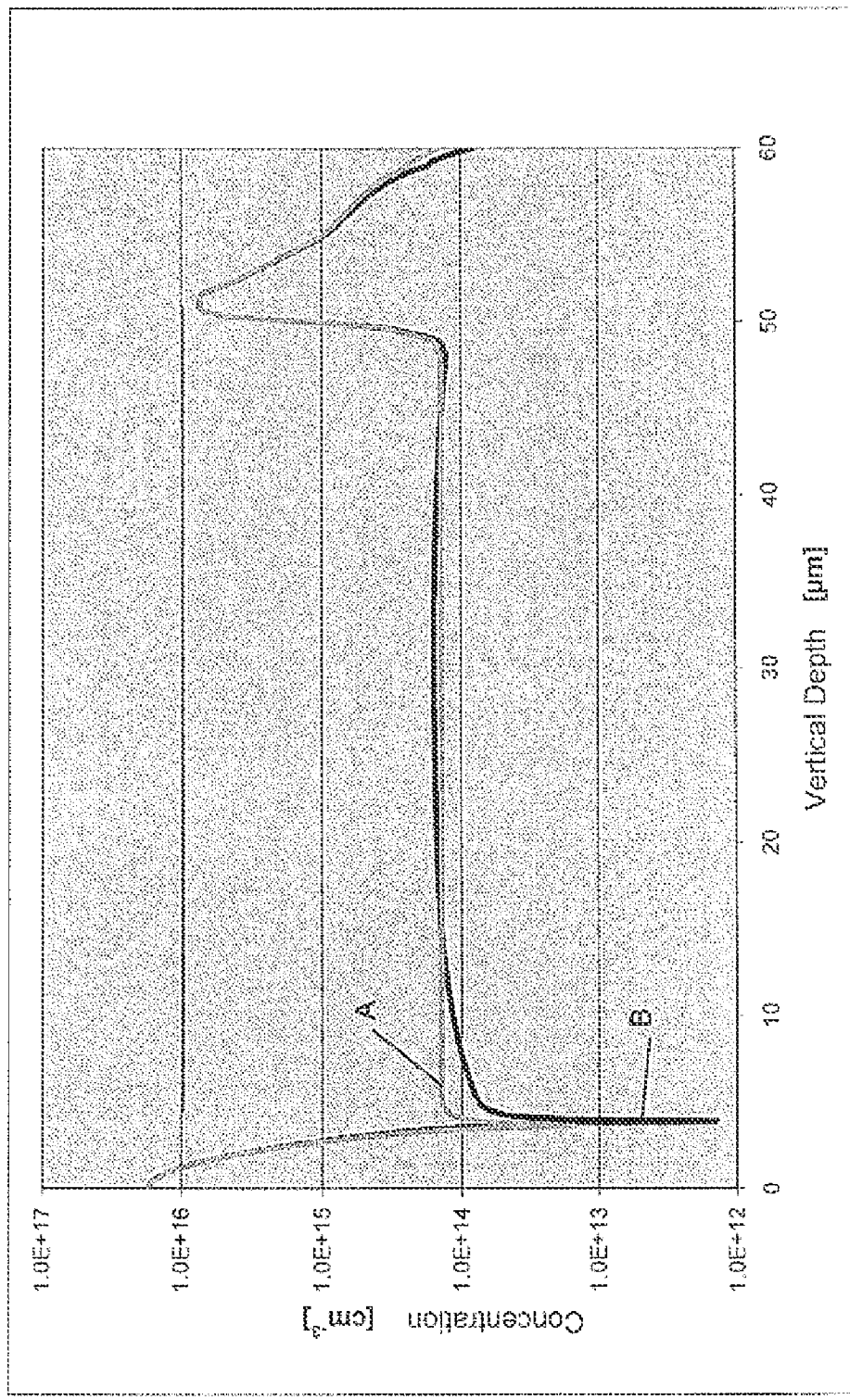
FIG. 7 is a plot of a selenium dopant diffusion profile for an IGBT recovery diode.

FIG. 7 shows the resulting dopant diffusion profile for an IGBT recovery diode. The anode (emitter) in this case used a boron dose of $2.5·10^{12}$ cm$^{-2}$, as well as a thermal budget of 1,150° C. and 200 minutes. The field stop zone has a profile which can be e.g. the result of proton irradiation with an energy of 700 keV and a dose of $5·10^{14}$ cm$^{-2}$. Since Se is a double donor as explained previously herein, the doping is adjusted accordingly. The concentrations determined in SR measurements do not correspond to the donor concentrations in the space charge zone. In order to determine these concentrations, the activation level of the Se centers must be determined from Fermi statistics. Both above mentioned energy levels, using 250 meV for the single charge donor and 496 meV for the double charge donor, lead in thermodynamic equilibrium (which can be subordinated to SR measurement because the underlying conductance measurements are carried out without the development of space charge layers) to different contributions to the concentration of electrons in the conductive band. This in turn leads to an activation level of 95.1% for the single charge center and only to 0.1% for the double charge center due to the deep energetic position.

Accordingly, the SR concentration approximately corresponds to the integral substitution Se atoms. In the space charge zone of the active device in which the near-Fermi level for the electrons is far below the equilibrium value when a blocking voltage is applied, the Se center is twice ionized to almost 100%. This is why the double concentration is applied from the SR measurements for the calculation of the field strength development. This has been already taken into account as shown in FIG. 7 (curve B), and compared to the concentration of constant base doping using for example phosphorus as a simple donor, where the dose itself is contained in the drift zone (curve A). The central doping level is thus in the region of about $1.4 \cdot 10^{14}$ cm$^{-3}$ and thus corresponds to a starting resistivity value of 30 Ωcm, which is acceptable e.g. with a 600 V recovery diode.

Figure 8:
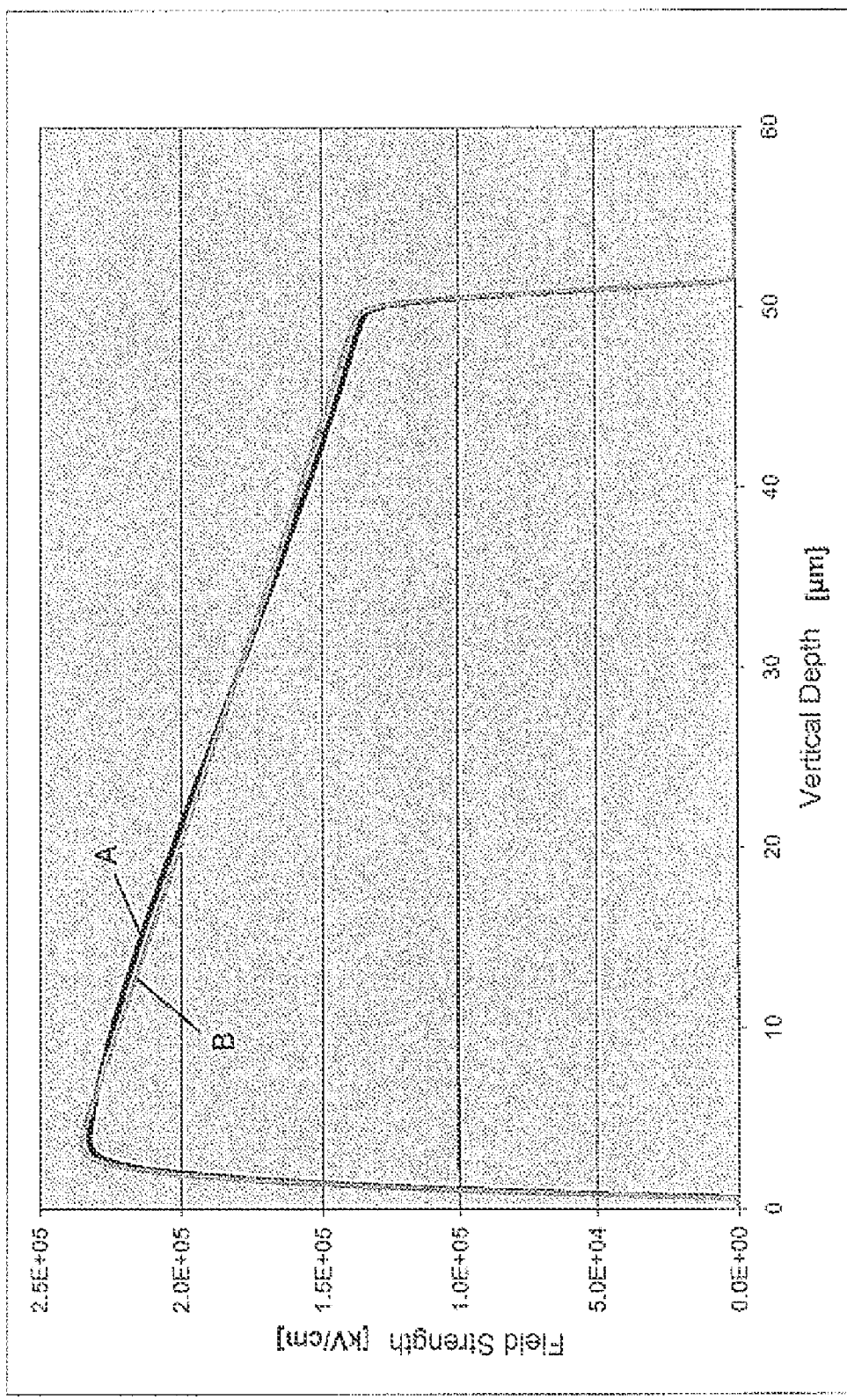
FIG. 8 is a plot of the intensity of an electric field represented by a vertical depth of a semiconductor component.

FIG. 8 shows the development of the intensity of the electric field represented by the vertical depth of the structural component. Curve A corresponds to a sample having an indiffusion of implanted Se atoms and curve B corresponds to a sample without an indiffusion of Se atoms. The avalanche breakdown field strength with this doping level is approximately at 230 kV/cm and the blocking voltage is approximately 930 V. Due to decreased concentration in the surface areas, a very small weakening of the strength of the field occurs with Se doping at the p+ n− transition as well as at the field stop zone with the same blocking voltage. This includes a release of the p+ n− transition, as well of the nn+ − transition at the field stop zone, which is connected at least with a tendency toward reserves with respect to switching robustness and softness. The examples thus also show that generally, instead of a constant base doping level, base doping which is increasing with a flat gradient and then decreasing again toward the field stop zone is realized with a local maximum in the central region of the drift zone, which can provide a certain advantage for vertical optimization. In addition to doping a previously undoped semiconductor substrate, the chalcogen indiffusion techniques described herein can also be used to form deep field stop zones in power semiconductor devices such as power diodes, power MOSFETs, IGBTs, JFETs, etc.

Figure 9:
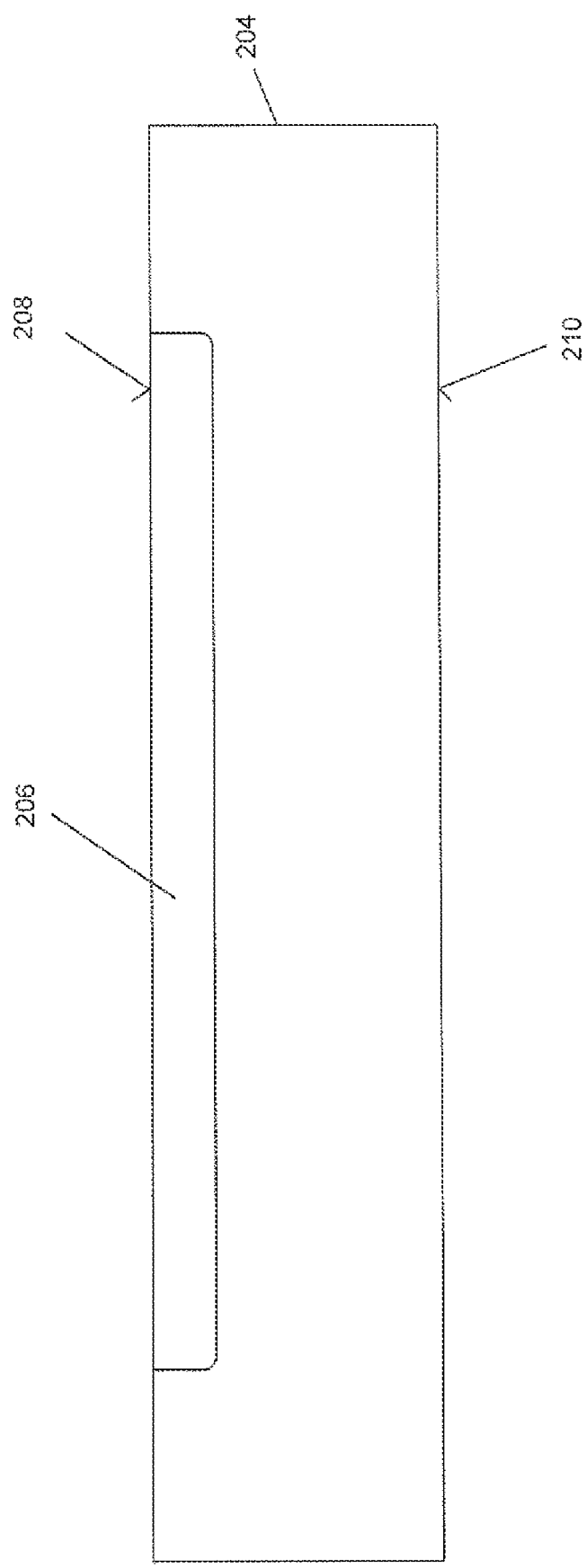
FIGS. 9-13 illustrate perspective cross-sectional views of a power diode during different process steps of forming a field stop zone according to an embodiment.

FIG. 9-13 illustrate the formation of a vertical power diode 200 having a field stop zone 202 formed by indiffusing chalcogen atoms into a semiconductor material 204 which contains self interstitials. FIG. 9 shows an anode region 206 of the diode 200 formed in the semiconductor material 204 such as a Si substrate or epitaxial layer. The anode 206 is formed at the front side 208 of the semiconductor material 204 via conventional processing. The region of the semiconductor material 204 below the anode 206 forms the base region of the diode 200, which terminates at the backside 210 of the diode 200.

Figure 10:
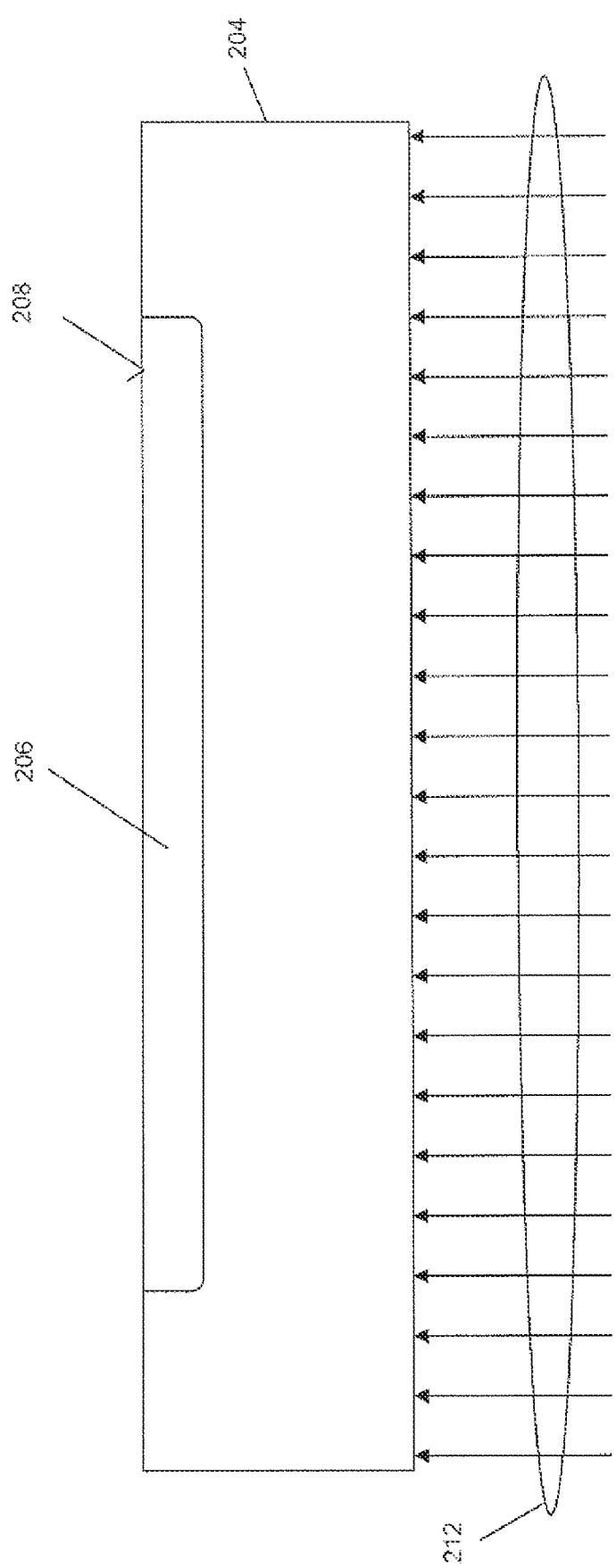

FIG. 10 shows the semiconductor material 204 during implantation of chalcogen atoms 212 such as Se, S or Te atoms. The chalcogen atoms 212 are implanted into the backside 210 of the semiconductor material 204 opposite the anode region 206.

Figure 11:
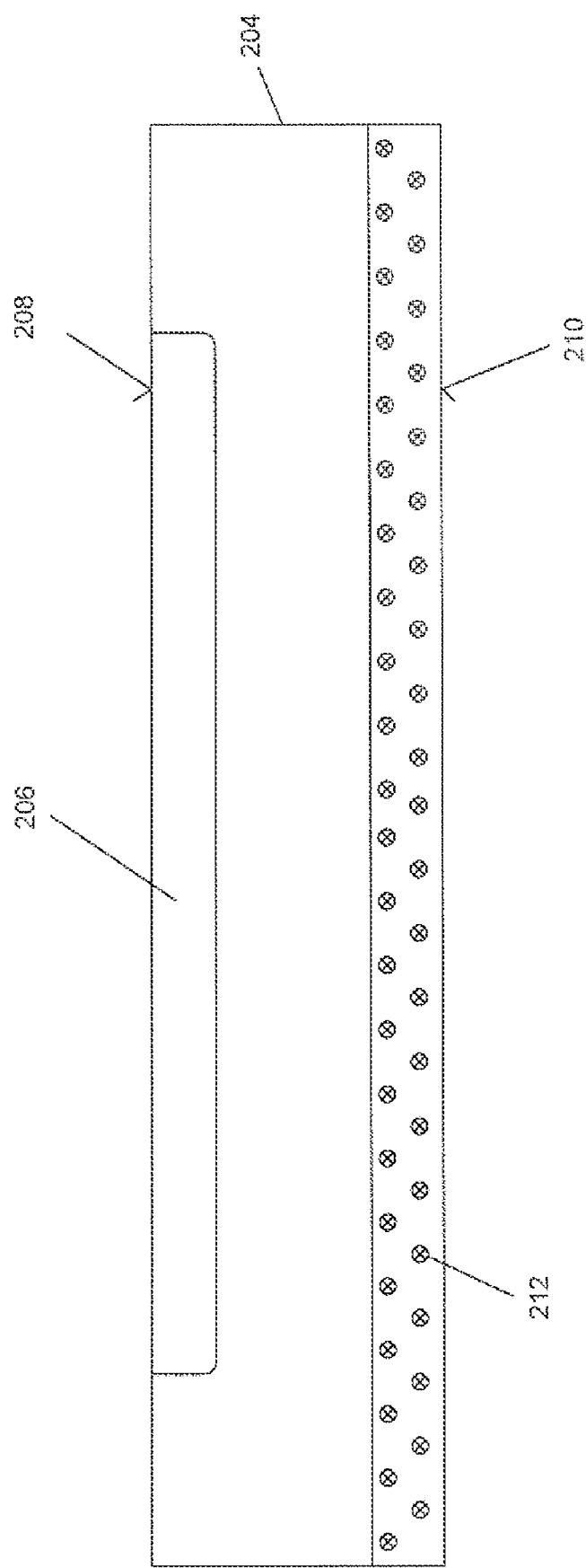

FIG. 11 shows the semiconductor material 204 after implantation of the chalcogen atoms 212. The chalcogen atoms 212 will form a field stop zone in the cathode region of the diode 200 after annealing.

Figure 12:
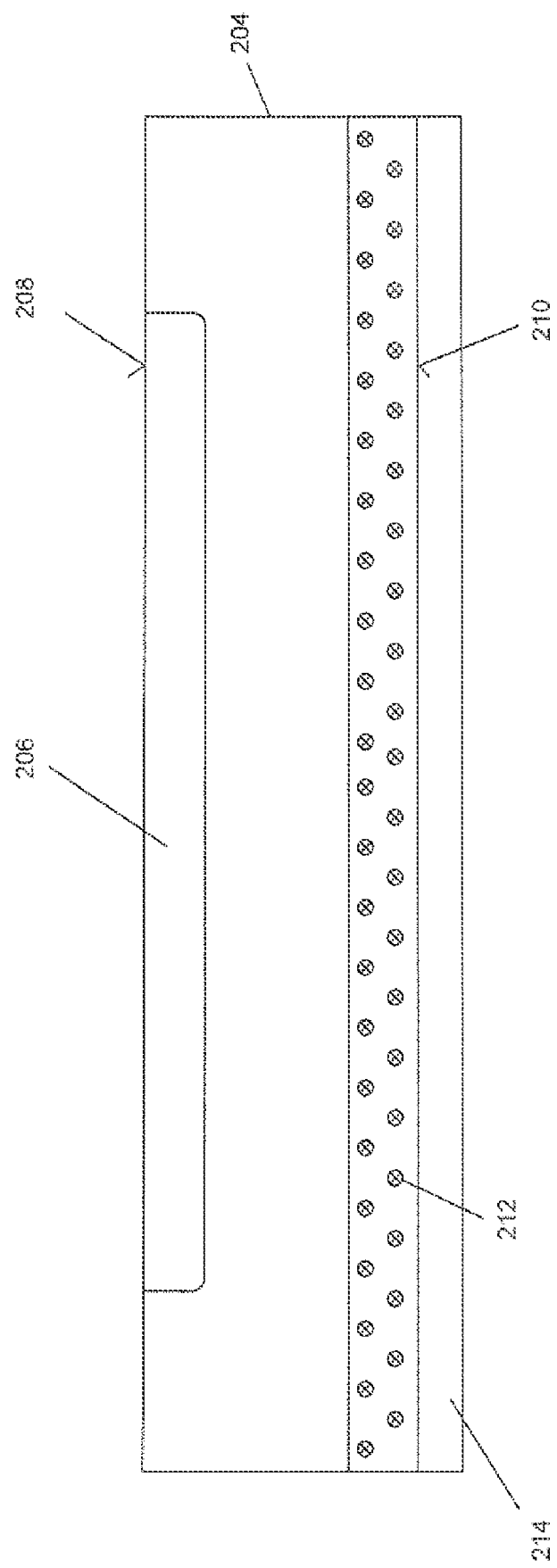

FIG. 12 shows the semiconductor material 204 after formation of a stress-inducing layer 214 such as phosphoric glass or thermal oxidation. The stress-inducing layer 214 applies stress to the backside 210 of the semiconductor material 204, causing self interstitials to release in the semiconductor material 204. Alternatively, the stress-inducing layer 214 can be formed prior to implantation of the chalcogen atoms 212 and removed prior to annealing as previously described herein.

Figure 13:
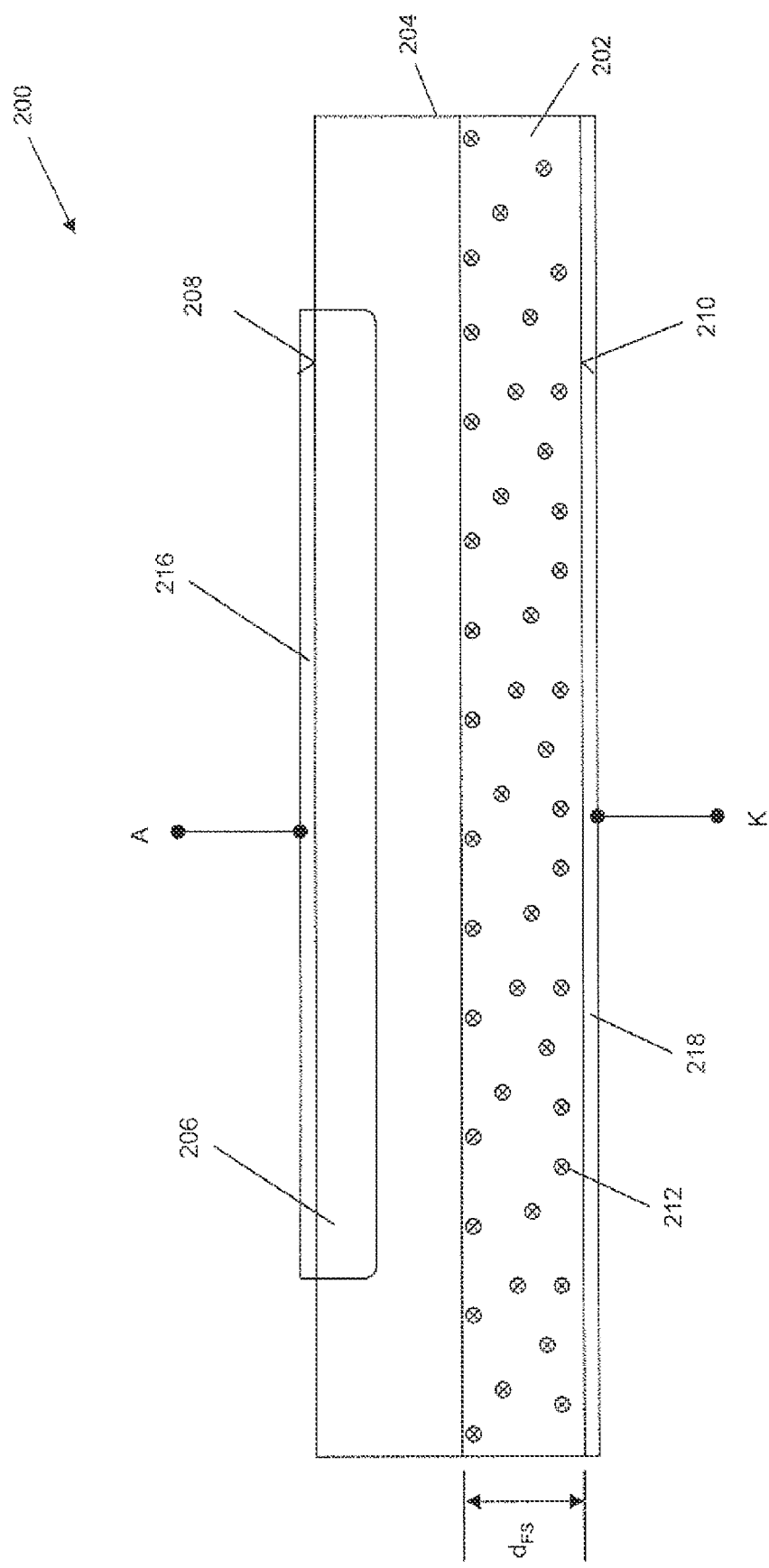

FIG. 13 shows the diode 200 after the field stop zone 202 is formed. The field stop zone 202 has a penetration depth ($d_{FS}$) from the backside 210 of the semiconductor material 204 and results from annealing the semiconductor material 204. The annealing causes the chalcogen atoms 212 to indiffuse deeper into the semiconductor material 204, under acceleration by the self interstitials. This way, the penetration depth is greater than what can be achieved by implanting chalcogen atoms absent the presence of self interstitials. The penetration depth is also a function of the anneal time and temperature, which is restricted because the device regions (anode, cathode) were formed prior to formation of the field stop zone 202. For example, the penetration depth can be 60 μm or deeper from the backside 210 of the semiconductor material 204 without exceeding the permitted thermal budget (time, temperature). An anode metallization 216 and cathode metallization 218 can be formed on the corresponding sides 208, 210 of the diode 200 to form an anode contact (A) and cathode contact (K), respectively.

If PH$_3$ is deposited to form the stress-inducing layer 214 as previously described herein, a highly doped n-emitter region is automatically indiffused in a manner suitable for generation of power. An additional implantation stage is therefore not necessary to form the backside cathode (emitter) according to this embodiment. Instead, the cathode is automatically formed by the indiffussion of phosphorous from the stress-inducing layer 214 which is used to apply stress in the semiconductor material 204 and thereby release self interstitials. The electrically active dose is in this case on the order of magnitude of approximately $10^{16}$ cm$^{-3}$ and the corresponding surface concentration of the phosphorous-containing stress-inducing layer 214 reaches at least values in the range from $10^{19}$ to $10^{20}$ cm$^{-3}$. The total concentration is limited with a previous deposition from the gas phase by the solubility of solid particles of phosphorus in e.g. silicon. This concentration is about $10^{21}$ cm$^{-3}$ at a deposition temperature of about 950° C. to 1,000° C. The total dose of phosphorus that is introduced in this manner is thus on the order of magnitude of $10^{17}$ to $10^{18}$ cm$^{-2}$.

Figure 14:
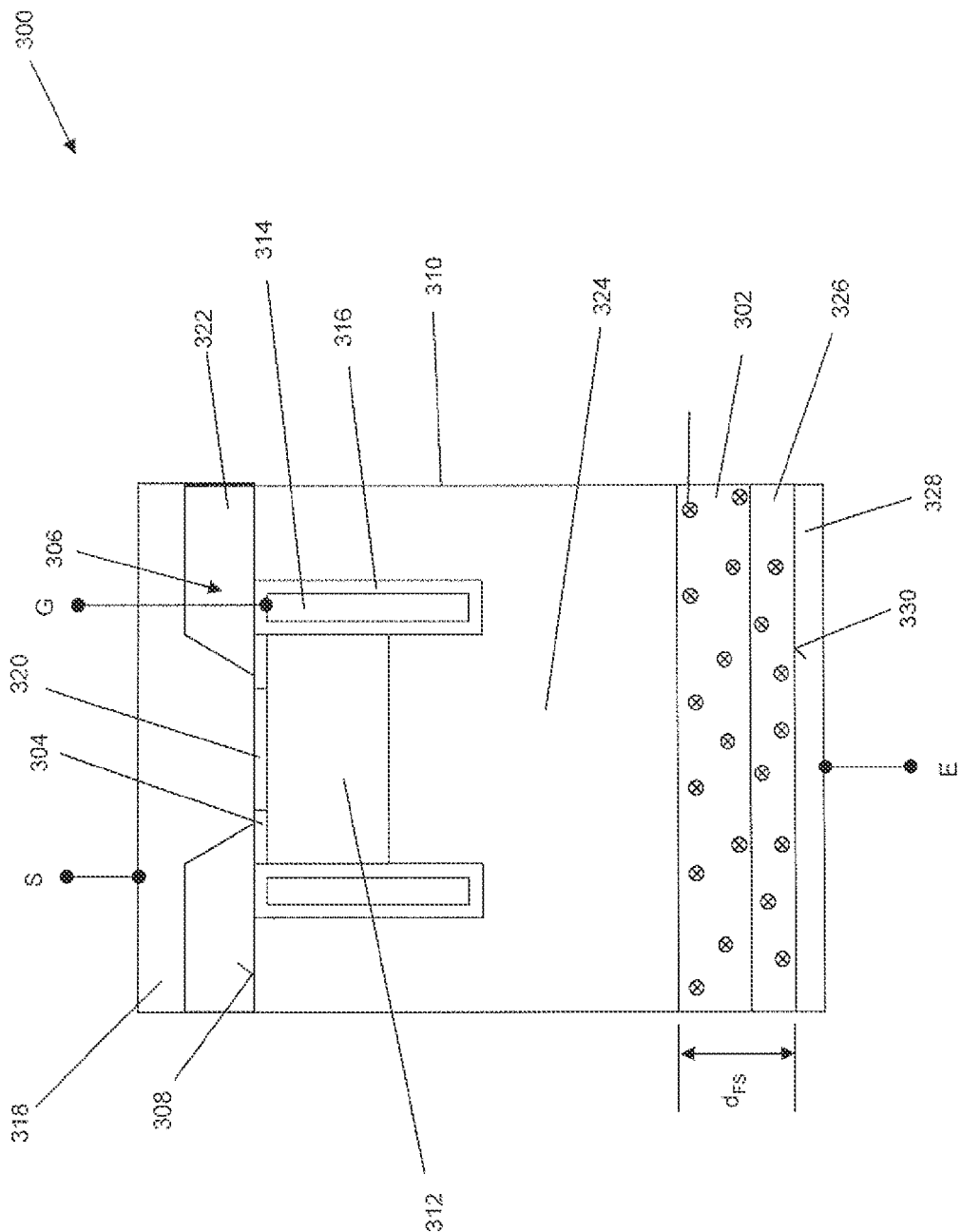
FIG. 14 illustrates a perspective cross-sectional view of an IGBT with a field stop zone formed from chalcogen atoms according to an embodiment.

FIG. 14 illustrates an embodiment of a vertical IGBT 300 having a backside field stop zone 302. Source 304 and gate regions 306 of the device 300 are formed at the front side 308 of a semiconductor material 310 such as a Si substrate or epitaxial layer. The source region 304 includes an (n+) region formed in a (p) body region 312. The gate region 306 includes a buried gate electrode 314 insulated from the surrounding semiconductor material by a gate dielectric material 316. A source electrode 318 contacts the source region 304 and a heavily doped (p+) region 320 of the body 312. The source electrode 318 is insulated from the gate electrode 314 by a dielectric layer 322. Below the body region 312 is a (n) drift zone 324, and below the drift zone 324 is a highly doped (p+) emitter region 326. The emitter region 326 is contacted by an emitter metallization 328. The active regions and metallizations of the IGBT 300 are formed using conventional processing steps.

The field stop zone 302 is formed at the backside 330 of the IGBT 300 by indiffusing chalcogen atoms 332 into the backside 330 in the presence of self interstitials. The field stop zone 302 can be formed prior to formation of the emitter metallization 328. The field stop zone 302 has a penetration depth ($d_{FS}$) of at least 30 μm, or of at least 50 μm, or of at least 90 μm e.g. as shown in FIG. 6. Such a deep field stop zone is well-suited for blocking electric fields of 600 V, 1200V or even higher. The depth of the field stop zone 302 is also a function of anneal temperature and duration as previously explained herein. A relatively deep field stop zone 302 of at least 30 µm, or of at least 50 µm, or of at least 90 µm can be realized according to the embodiments described herein without exceeding the thermal budget (time, temperature) which is needed to protect the integrity of the device regions already formed.

If a highly doped phosphorus zone results by creating the stress-inducing layer from deposited $PH_3$, the highly doped phosphorus zone can be subsequently removed. This can be performed for example with etching in a spin etch process, which is typically performed after wafer grinding.

Figure 15:
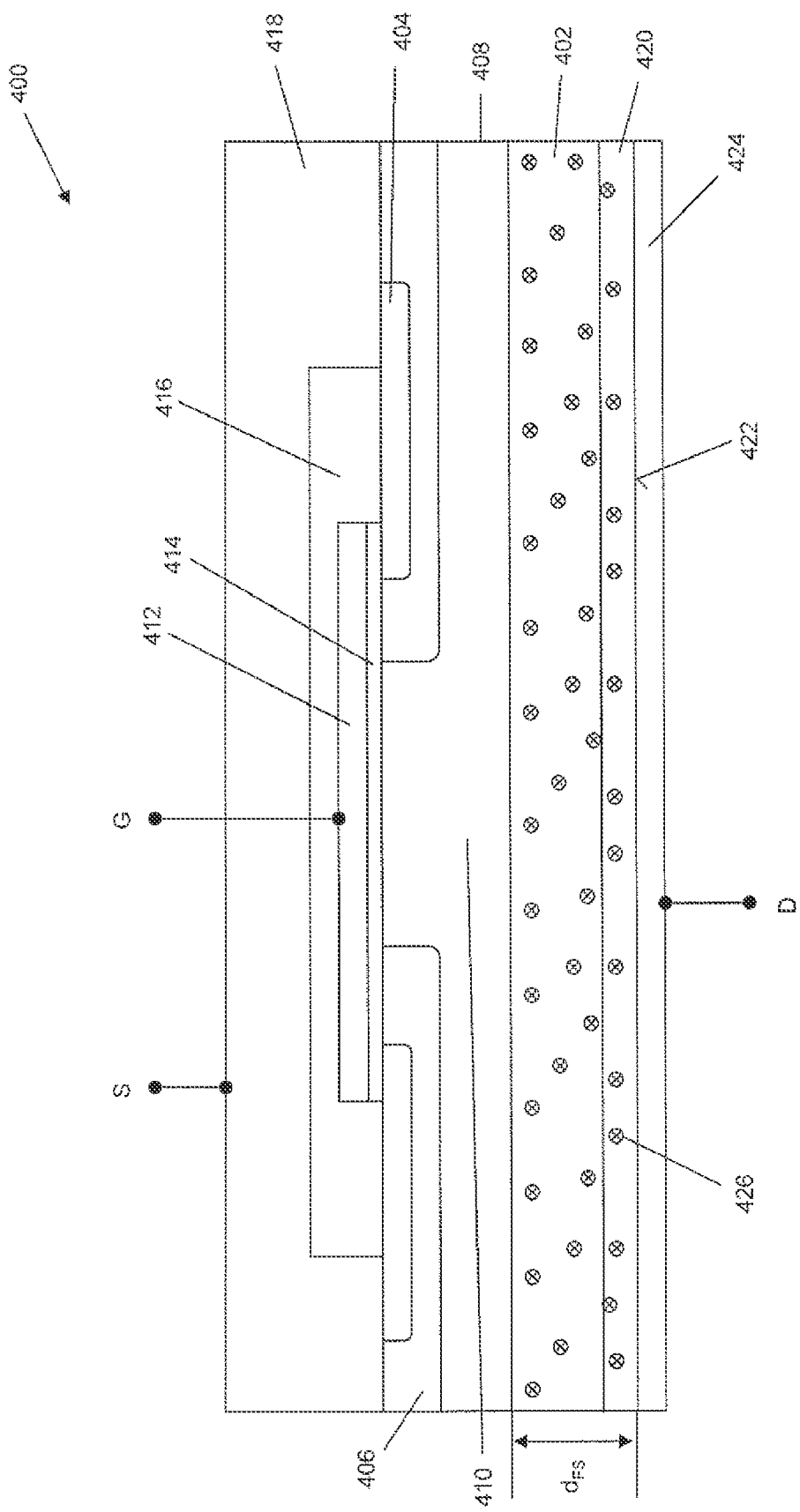
FIG. 15 illustrates a perspective cross-sectional view of a power MOSFET with a field stop zone formed from chalcogen atoms according to an embodiment.

FIG. 15 illustrates an embodiment of a vertical power MOSFET 400 having a backside field stop zone 402. Oppositely doped source and body regions 404, 406 are formed in the upper part of a semiconductor material 408 such as a Si substrate or epitaxial layer. A drift zone 410 is formed below the body region 406. A gate includes a gate conductor 412 which provides a gate contact (G) insulated from the underlying channel region by a gate insulator 414. An insulator layer 416 is disposed over the gate conductor 412 to insulate the gate conductor 412 from a source metallization 418 which provides a source contact (S). A heavily doped drain region 420 is formed at the backside 422 of the power MOSFET 400, and is contacted by a drain metallization 424 to provide a drain contact (D). The active regions and metallizations of the power MOSFET 400 are formed using conventional processing steps.

The field stop zone 402 is formed at the backside 422 of the power MOSFET 400 by indiffusing chalcogen atoms 426 into the backside 422 in the presence of self interstitials. The field stop zone 402 can be formed prior to formation of the drain metallization 424. The field stop zone 402 has a penetration depth ($d_{FS}$) of at least 30 µm, or of at least 50 µm, or of at least 90 µm e.g. as shown in FIG. 6 and as previously described herein.

Field stop zones for other types of power semiconductor devices can be fabricated in accordance with the embodiments described herein. For example, a JFET or thyristor can include a backside field stop zone formed by implanting chalcogen atoms into the backside in the presence of self interstitials followed by annealing within the permitted thermal budget (time, temperature). Also, any desired field stop zone can be created for a tailor-made field stop profile by repeating the processes described herein several times and/or by changing the process parameters during the depositing (e.g. $PH_3$) and chalcogen introduction steps.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of doping an undoped power semiconductor substrate, comprising:
    applying stress at a side of the undoped semiconductor substrate to release self interstitials in the substrate, by forming a stress-inducing layer on the side which causes the self interstitials to be released in the substrate;
    implanting chalcogen atoms into the side of the substrate; and
    annealing the substrate to form a first semiconductor region containing the chalcogen atoms and a second semiconductor region devoid of the chalcogen atoms, the first semiconductor region having a doping concentration higher than the doping concentration of the second semiconductor region.

2. The method of claim 1, wherein the stress-inducing layer comprises phosphorous.

3. The method of claim 2, wherein forming the stress-inducing layer on the side comprises forming a phosphoric glass on the side in an atmosphere comprising $PH_3$ for at least 200 minutes at a temperature of at least 900° C.

4. The method claim 1, wherein the stress-inducing layer is formed on the side after the chalcogen atoms are implanted into the side of the substrate.

5. The method of claim 1, wherein forming the stress-inducing layer on the side comprises forming an oxide layer on the side.

6. The method of claim 1, wherein the undoped semiconductor substrate is an undoped silicon substrate, the method further comprising:
    forming a stress-inducing layer on the side of the undoped silicon substrate to impart stress which releases silicon self interstitials in the silicon substrate;
    removing the stress-inducing layer after the silicon self interstitials are released;
    implanting the chalcogen atoms into the side of the silicon substrate after the stress-inducing layer is removed; and
    annealing the silicon substrate so that the chalcogen atoms indiffuse into the silicon substrate to a depth of at least 30 µm from the side.

7. The method of claim 6, wherein the silicon substrate is annealed so that the chalcogen atoms indiffuse into the silicon substrate to a depth of at least 50 µm from the side.

8. The method of claim 1, wherein the chalcogen atoms indiffuse into the substrate to a depth of at least 80 µm from the side at a concentration of at least $1.0^{12}$ $cm^{-3}$.

9. The method of claim 1, wherein implanting the chalcogen atoms into the side of the substrate comprises implanting a dose of at least $6 \cdot 10^{13}$ $cm^{-2}$ selenium atoms into the side at an energy of at least 150 keV.

10. The method of claim 1, wherein the annealing is performed for less than 60 minutes at a temperature less than 1000° C.

11. A method of fabricating a power semiconductor component, comprising:
    forming an active region of a semiconductor device in a first region of a semiconductor substrate adjacent a first side of the semiconductor substrate;

applying stress at a second side of the semiconductor substrate opposite the first side so that self interstitials are released in a second region of the semiconductor substrate adjacent the second side, by forming a stress-inducing layer on the second side which causes the self interstitials to be released in the second region;

implanting chalcogen atoms into the second side of the semiconductor substrate;

and annealing the semiconductor substrate so that the chalcogen atoms indiffuse into the semiconductor substrate to form a field stop zone in the second region which extends from the second side into the semiconductor substrate.

12. The method of claim 11, wherein forming the stress-inducing layer on the second side comprises forming a phosphoric glass on the second side in an atmosphere comprising $PH_3$ for at least 200 minutes at a temperature of at least 900° C.

13. The method of claim 11, wherein the stress-inducing layer is formed on the second side after the chalcogen atoms are implanted into the second side.

14. The method of claim 13, wherein the semiconductor substrate is a silicon substrate, the method further comprising:

forming a stress-inducing layer on the second side of the silicon substrate to impart stress which releases silicon self interstitials in the second region of the silicon substrate;

removing the stress-inducing layer after the silicon self interstitials are released;

implanting the chalcogen atoms into the second side of the silicon substrate after the stress-inducing layer is removed; and annealing the silicon substrate so that the chalcogen atoms indiffuse into the silicon substrate to form the field stop zone.

15. The method of claim 11, wherein the chalcogen atoms indiffuse into the substrate to a depth of at least 80 μm from the second side at a concentration of at least $1.0^{12}$ cm$^{-3}$.

16. The method of claim 11, wherein implanting the chalcogen atoms into the second side of the substrate comprises implanting a dose of at least $6 \cdot 10^{13}$ cm$^{-2}$ selenium atoms into the second side at an energy of at least 150 keV.

17. The method of claim 11, wherein the annealing is performed for less than 60 minutes at a temperature less than 1000° C.

* * * * *